United States Patent
Hamdan (10) Patent No.: US 9,837,995 B2
(45) Date of Patent: Dec. 5, 2017

(54) CLOCK GATING USING A DELAY CIRCUIT

(71) Applicant: QUALCOMM Incorporated, San Diego, CA (US)

(72) Inventor: Fadi Adel Hamdan, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 14/810,243

(22) Filed: Jul. 27, 2015

(65) Prior Publication Data

US 2017/0033775 A1    Feb. 2, 2017

(51) Int. Cl.

| | |
|---|---|
| *G06F 1/12* | (2006.01) |
| *H03K 3/037* | (2006.01) |
| *G06F 13/362* | (2006.01) |
| *H03K 5/131* | (2014.01) |
| *H03K 5/135* | (2006.01) |
| *G06F 1/10* | (2006.01) |
| *G06F 1/32* | (2006.01) |
| *H03K 5/00* | (2006.01) |

(52) U.S. Cl.
CPC ............ *H03K 3/0372* (2013.01); *G06F 1/10* (2013.01); *G06F 1/12* (2013.01); *G06F 1/3237* (2013.01); *G06F 13/362* (2013.01); *H03K 3/0375* (2013.01); *H03K 5/131* (2013.01); *H03K 5/135* (2013.01); *H03K 2005/00013* (2013.01); *H03K 2005/00058* (2013.01); *Y02B 60/1221* (2013.01)

(58) Field of Classification Search
CPC ..... G06F 1/12; G06F 1/14; G06F 1/10; G06F 5/06; G06F 13/1689; G06F 1/08; G06F 1/04; G06F 1/3202; G06F 9/4825; G06F 11/0757; G06F 11/3419; G11C 7/22
See application file for complete search history.

(56) References Cited

U.S. PATENT DOCUMENTS

| | | | |
|---|---|---|---|
| 6,073,246 | A | 6/2000 | Song et al. |
| 7,323,909 | B2 | 1/2008 | Mamidipaka |
| 7,772,906 | B2 | 8/2010 | Naffziger |
| 8,103,941 | B2 | 1/2012 | Naffziger |

(Continued)

FOREIGN PATENT DOCUMENTS

EP    2320565 A1    5/2011

OTHER PUBLICATIONS

International Search Report and Written Opinion for International Application No. PCT/US2016/039568, ISA/EPO, dated Sep. 7, 2016, 13 pgs.

*Primary Examiner* — Zahid Choudhury
(74) *Attorney, Agent, or Firm* — Qualcomm Incorporated-Toler (57) ABSTRACT

An apparatus includes a latch of a clock gating circuit (CGC). The latch is configured to generate a first signal in response to a clock signal. The apparatus further includes a delay circuit of the CGC. The delay circuit is configured to receive the clock signal and to generate a second signal based on the clock signal and the first signal. The apparatus further includes an output circuit of the CGC. The output circuit is coupled to the delay circuit and to the latch. The output circuit is configured to generate a master clock signal based on the clock signal and the second signal. An edge of the master clock signal is delayed with respect to an edge of the clock signal based on a delay characteristic associated with a slave clock signal.

20 Claims, 5 Drawing Sheets

(56) References Cited

U.S. PATENT DOCUMENTS

| | | |
|---|---|---|
| 8,164,374 B2 | 4/2012 | Irie |
| 2009/0115469 A1 | 5/2009 | Cortadella et al. |
| 2009/0256593 A1* | 10/2009 | Naffziger ........... H03K 3/35625 326/96 |
| 2011/0194575 A1 | 8/2011 | Chen et al. |
| 2013/0117598 A1 | 5/2013 | Lee |
| 2014/0225655 A1 | 8/2014 | Rasouli et al. |
| 2015/0121327 A1 | 4/2015 | Kamal et al. |

* cited by examiner

CLOCK GATING USING A DELAY CIRCUIT

I. FIELD

The present disclosure is generally related to electronic devices and more particularly to clock gating for electronic devices.

II. DESCRIPTION OF RELATED ART

A processor may include multiple pipeline stages that perform pipelined execution of instructions. For example, the pipeline stages may fetch instructions from a memory, decode the instructions, execute the instructions to generate results, and write the results back to the memory. An output of one pipeline stage may be coupled to an input of another pipeline stage via one or more flip-flops. A flip-flop may include multiple latches, such as a master latch and a slave latch, which may be driven by separate clock signals.

Some devices deactivate the flip-flops in order to reduce power consumption when data is not being transferred between the pipeline stages. For example, the master latch may be activated when results are ready to be transferred from one pipeline stage to the slave latch. The master latch may be deactivated after providing the results to the slave latch, and the slave latch may be deactivated after providing the results to another pipeline stage.

If separate circuits are used to deactivate the master latch and the slave latch, a "race" condition can result in some circumstances. For example, if the slave latch is activated too soon (e.g., due to clock skew), then results may be transferred to another pipeline stage too early (e.g., creating a "half cycle path" that may be undesirable in some circuits). Some devices may avoid such an operating state by using a single circuit to deactivate the master latch and the slave latch. This technique may result in higher power consumption in a device where the master latch and the slave latch are activated at different times.

III. SUMMARY

A clock gating circuit (CGC) may be configured to delay a particular edge (e.g., a falling edge) of a master clock signal provided to a master latch. Delaying an edge of the master clock signal may avoid an operating state in which the master latch and one or more slave latches are activated simultaneously. For example, a falling edge of the master clock signal may occur substantially simultaneously with or after a falling edge of a slave clock signal provided to the one or more slave latches. If the one or more slave latches have a phase one (phi-1) configuration (where the one or more slave latches are triggered by rising edges of the slave clock signal) and the master latch has a phase two (phi-2) configuration (where the master latch is triggered by falling edges of the master clock signal), then delaying the falling edge of the master clock signal may avoid concurrent activation of both the master latch and the one or more slave latches. Avoiding concurrent activation of both the master latch and the one or more slave latches may avoid a "race" condition in some circumstances, such as when the one or more slave latches are activated sooner than designed (e.g., due to clock skew).

In an illustrative implementation, the CGC includes a latch, a second latch, an output circuit, and a delay circuit. The latch, the second latch, the delay circuit, and the output circuit may be configured to receive a clock signal (e.g., a clock signal used to generate the master clock signal). The delay circuit may be controlled using an internal signal of the CGC (e.g., instead of providing a separate signal from a device external to the CGC), which may reduce circuit complexity and power consumption. For example, the delay circuit may be controlled (e.g., power-gated) using an output of the first latch. In some configurations, the delay circuit and the latch form a first clock gating sub-circuit (e.g., a phi-1 CGC), and the second latch of the CGC and the output circuit form a second clock gating sub-circuit (e.g., a phi-2 CGC).

In a particular example, an apparatus includes a latch of a clock gating circuit (CGC). The latch is configured to generate a first signal in response to a clock signal. The apparatus further includes a delay circuit of the CGC. The delay circuit is configured to receive the clock signal and to generate a second signal based on the clock signal and the first signal. The apparatus further includes an output circuit of the CGC. The output circuit is coupled to the delay circuit and to the latch. The output circuit is configured to generate a master clock signal based on the clock signal and the second signal. An edge of the master clock signal is delayed with respect to an edge of the clock signal based on a delay characteristic associated with a slave clock signal.

In another particular example, a method of operation of a CGC includes receiving a clock signal at a CGC. The method further includes generating a first signal by a latch of the CGC and generating a master clock signal using a delay circuit of the CGC in response to the clock signal and the first signal generated by the latch. An edge of the master clock signal is delayed with respect to an edge of the clock signal based on a delay characteristic associated with a slave clock signal.

In another particular example, an apparatus includes means for generating a first signal at a CGC and further includes means for receiving a clock signal at the CGC. The apparatus further includes means for generating, in response to the clock signal and the first signal, a master clock signal using a delay circuit of the CGC. An edge of the master clock signal is delayed with respect to an edge of the clock signal based on a delay characteristic associated with a slave clock signal.

One particular advantage provided by at least one of the disclosed examples is reduced power consumption while avoiding, or reducing likelihood of, hazards (e.g., race conditions). To illustrate, devices that utilize a single CGC to clock gate a master latch and a slave latch may avoid hazards but increase power consumption (because the master latch and the slave latch cannot be clock gated separately). Devices that utilize separate CGCs to clock gate a master latch and a slave latch may create hazards (e.g., due to clock skew). A device in accordance with the disclosure may separately clock gate a master latch and a slave latch (reducing power consumption) without creating a race condition (if clock skew occurs). Other examples, advantages, and features of the disclosure will become apparent after review of the entire application, including the following sections: Brief Description of the Drawings, Detailed Description, and the Claims.

V. DETAILED DESCRIPTION

Figure 1:
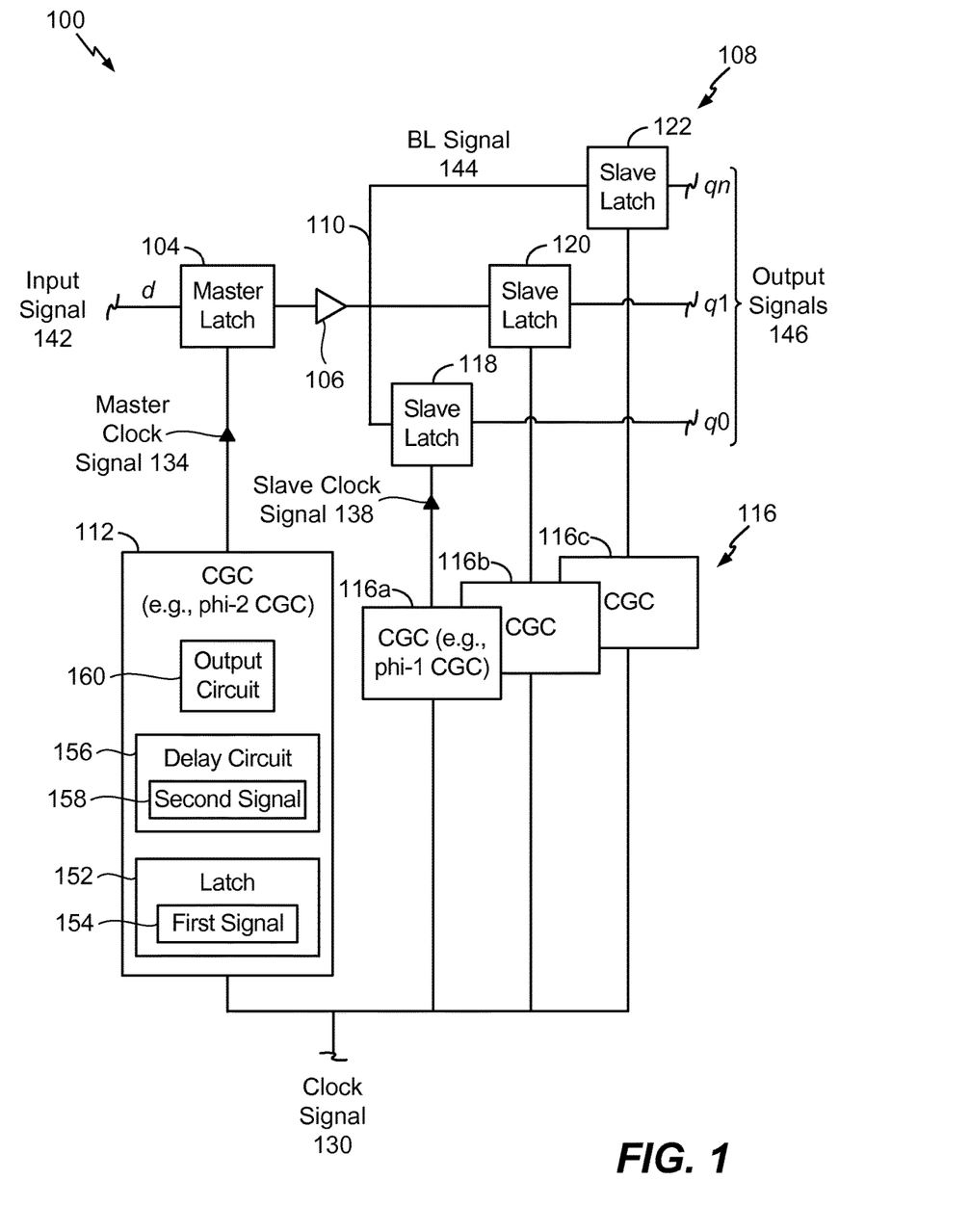
FIG. 1 is a block diagram of an illustrative example of an apparatus that includes a clock gating circuit (CGC) having a delay circuit.

Referring to FIG. 1, an illustrative example of a device is depicted and generally designated 100. The device 100 may be implemented in an electronic device, such as within a processor. For example, the device 100 may be coupled between pipeline stages of a pipelined processor (e.g., to provide results from an output of one pipeline stage to an input of another pipeline stage). To further illustrate, the device 100 may be integrated between pipeline stages of a pipelined digital signal processor (DSP), a pipelined central processing unit (CPU), a pipelined graphics processing unit (GPU), a pipelined applications processor (AP), or another pipelined processing device, as illustrative examples. In other cases, the device 100 may be integrated within another device, such as a data interface configured to communicate data between devices.

The device 100 includes a master latch 104. The master latch 104 may be configured to receive an input signal 142. For example, the master latch 104 may be configured to receive the input signal 142 from a first pipeline stage of a pipelined processor.

The device 100 further includes one or more second latches, such as a plurality of slave latches 108. The plurality of slave latches 108 may include a first slave latch 118, a second slave latch 120, and a third slave latch 122. It should be appreciated that the example of FIG. 1 is illustrative and that the device 100 may include a different number of slave latches (e.g., one slave latch, two slave latches, four slave latches, or another positive integer n of slave latches). The plurality of slave latches 108 may be configured to generate output signals 146. For example, the plurality of slave latches 108 may be configured to provide the output signals 146 to a second pipeline stage of a pipelined processor.

To further illustrate, the master latch 104 and the plurality of slave latches 108 may form a flip-flop, such as a "D" flip-flop. In this case, the input signal 142 may correspond to a data input signal (d), and the output signals 146 may correspond to a plurality of flip-flop data output signals (q). The output signals 146 may include a first output signal (q0) generated by the first slave latch 118, a second output signal (q1) generated by the second slave latch 120, and a third output signal (qn) generated by the third slave latch 122.

The master latch 104 is coupled to each latch of the plurality of slave latches 108. To illustrate, the device 100 may further include a driver 106 (e.g., a buffer) and a bit line (BL) 110. The driver 106 may be coupled to the BL 110. The driver 106 may be coupled to an output of the master latch 104, and the BL 110 may be coupled to an input of each of the plurality of slave latches 108. The master latch 104 may be configured to provide a signal, such as a BL signal 144, to the plurality of slave latches 108 using the driver 106 and the BL 110.

The device 100 further includes a first clock gating circuit (CGC) 112. The first CGC 112 is coupled to the master latch 104. The first CGC 112 may be configured to receive a clock signal 130 and to gate the clock signal 130 to reduce power consumption by the master latch 104 (e.g., so that the master latch 104 is not activated and deactivated by transitions in the clock signal 130). For example, the first CGC 112 may be configured to generate a master clock signal 134 based on the clock signal 130. The clock signal 130 may be a synchronous clock signal that is provided to each flip-flop that is coupled between pipeline stages of a device. The first CGC 112 may be configured to provide the master clock signal 134 to the master latch 104.

The first CGC 112 includes a latch 152 (e.g., a phi-2 hold latch), a delay circuit 156, and an output circuit 160. The output circuit 160 may be coupled to the master latch 104 and may be configured to provide the master clock signal 134 to the master latch 104. The first CGC 112 may be configured to generate the master clock signal 134 by using the delay circuit 156 to delay particular edges (e.g., falling edges) of the clock signal 130, such as by delaying falling edges of the clock signal 130 without affecting or without substantially affecting timing of rising edges of the clock signal 130 during generation of the master clock signal 134. In this case, falling edges of the master clock signal 134 may be delayed with respect to the clock signal 130, and rising edges of the master clock signal 134 may occur simultaneously or substantially simultaneously with respect to the clock signal 130.

The device 100 may further include one or more second CGCs, such as a plurality of second CGCs 116. Each of the plurality of second CGCs 116 may be coupled to a corresponding latch of the plurality of slave latches 108. For example, the plurality of second CGCs 116 may include a CGC 116a coupled to the first slave latch 118, a CGC 116b coupled to the second slave latch 120, and a CGC 116c coupled to the third slave latch 122. In this example, the plurality of slave latches 108 includes n slave latches, and the plurality of second CGCs 116 includes n CGCs. The plurality of second CGCs 116 may be configured to receive the clock signal 130. The plurality of second CGCs 116 may be configured to generate a plurality of slave clock signals (which may include a representative slave clock signal 138) based on the clock signal 130. Each of the plurality of second CGCs 116 may be configured to provide a corresponding one of the plurality of slave clock signals to a corresponding one of the plurality of slave latches 108. As an illustrative example, the CGC 116a may be configured to generate the slave clock signal 138 and to provide the slave clock signal 138 to the first slave latch 118.

The plurality of slave latches 108 may have a phase one (phi-1) configuration. In this case, the plurality of slave latches 108 may be triggered by rising edges of slave clock signals generated by the plurality of second CGCs 116. As an illustrative example, the first slave latch 118 may be triggered by rising edges of the slave clock signal 138. Accordingly, the plurality of slave latches 108 may be "transparent" while slave clock signals generated by the plurality of second CGCs 116 have a high logic value (e.g., the plurality of slave latches 108 may output the BL signal 144 when the slave clock signals have a high logic value). The master latch 104 may have a phase two (phi-2) configuration. In this case, the master latch 104 may be triggered by falling edges of the master clock signal 134. Accordingly, the master latch 104 may be "transparent" while the master clock signal 134 has a low logic value (e.g., the master latch 104 may output the input signal 142 when the master clock signal 134 has a low logic value). The first CGC 112 may be referred to as a phi-2 CGC, and each of the plurality of second CGCs 116 may be referred to as a phi-1 CGC.

In operation, the first CGC 112 may receive the clock signal 130. In an illustrative example, the latch 152, the delay circuit 156, and the output circuit 160 are each configured to receive the clock signal 130. The latch 152 may generate a first signal 154 in response to the clock signal 130. The delay circuit 156 may be responsive to the first signal 154. For example, in some implementations, the first signal 154 may be provided directly to the delay circuit 156. In other cases, the first signal 154 may be provided indirectly to the delay circuit 156, such as using one or more logic gates (e.g., an OR gate used during a testing process), as described further with reference to FIG. 2.

The delay circuit 156 may be configured to generate a second signal 158 in response to the first signal 154. The delay circuit 156 may be configured to operate based on a delay characteristic associated with the slave clock signal 138 (e.g., based on a potential (or "maximum") clock skew associated with the slave clock signal 138). As an illustrative example, the delay circuit 156 may be configured to delay a transition of the second signal 158 from a first logic value (e.g., a high logic value) to a second logic value (e.g., a low logic value) in response to a transition of one or more of the clock signal 130 or the first signal 154 from the first logic value to the second logic value. Because the output circuit 160 may be configured to "hold" a first logic value of the master clock signal 134 until expiration of a delay interval, an edge (e.g., a falling edge) of the master clock signal 134 may be delayed (e.g., to avoid a falling edge of the master clock signal 134 occurring prior to a corresponding falling edge of the slave clock signal 138).

The first CGC 112 may selectively provide the master clock signal 134 to the master latch 104. For example, if data is not being received at the master latch 104, the first CGC 112 may avoid generating the master clock signal 134 (to avoid activating and deactivating the master latch 104). If data (e.g., the input signal 142) is being received at the master latch 104, the first CGC 112 may provide the master clock signal 134 to the master latch 104 (to cause the master latch 104 to transfer the input signal 142 to the plurality of slave latches 108). The plurality of second CGCs 116 may selectively provide slave clock signals to the plurality of slave latches 108. For example, the CGC 116a may provide the slave clock signal 138 to the first slave latch 118 if data is being provided to the first slave latch 118 by the master latch 104.

The delay circuit 156 may cause falling edges of the master clock signal 134 to be delayed with respect to falling edges of the clock signal 130. For example, the delay circuit 156 may be configured to ensure that a falling edge of the master clock signal 134 occurs after a falling edge of the slave clock signal 138 (and prior to a subsequent rising edge of the slave clock signal 138), such as based on a potential (or "maximum") clock skew associated with the slave clock signal 138 based on the particular circuit design, fabrication technology, physical layout, one or more other parameters, or a combination thereof. An illustrative implementation of the delay circuit 156 is described further with reference to FIG. 2.

Delaying falling edges of the master clock signal 134 relative to falling edges of the clock signal 130 may avoid an operating state in which the master clock signal 134 has a low logic value while one or more slave clock signals have a high logic value (e.g., if a falling edge of the master clock signal 134 occurs slightly before a falling edge of the slave clock signal 138). To illustrate, if the master latch 104 has a phi-2 configuration (and is triggered by falling edges of the master clock signal 134) and the first slave latch 118 has a phi-1 configuration (and is triggered by rising edges of the slave clock signal 138), then such an operating state may cause both the master latch 104 and the first slave latch 118 to be transparent during a common clock cycle. By delaying falling edges of the master clock signal 134, such an operating state may be avoided.

Figure 2:
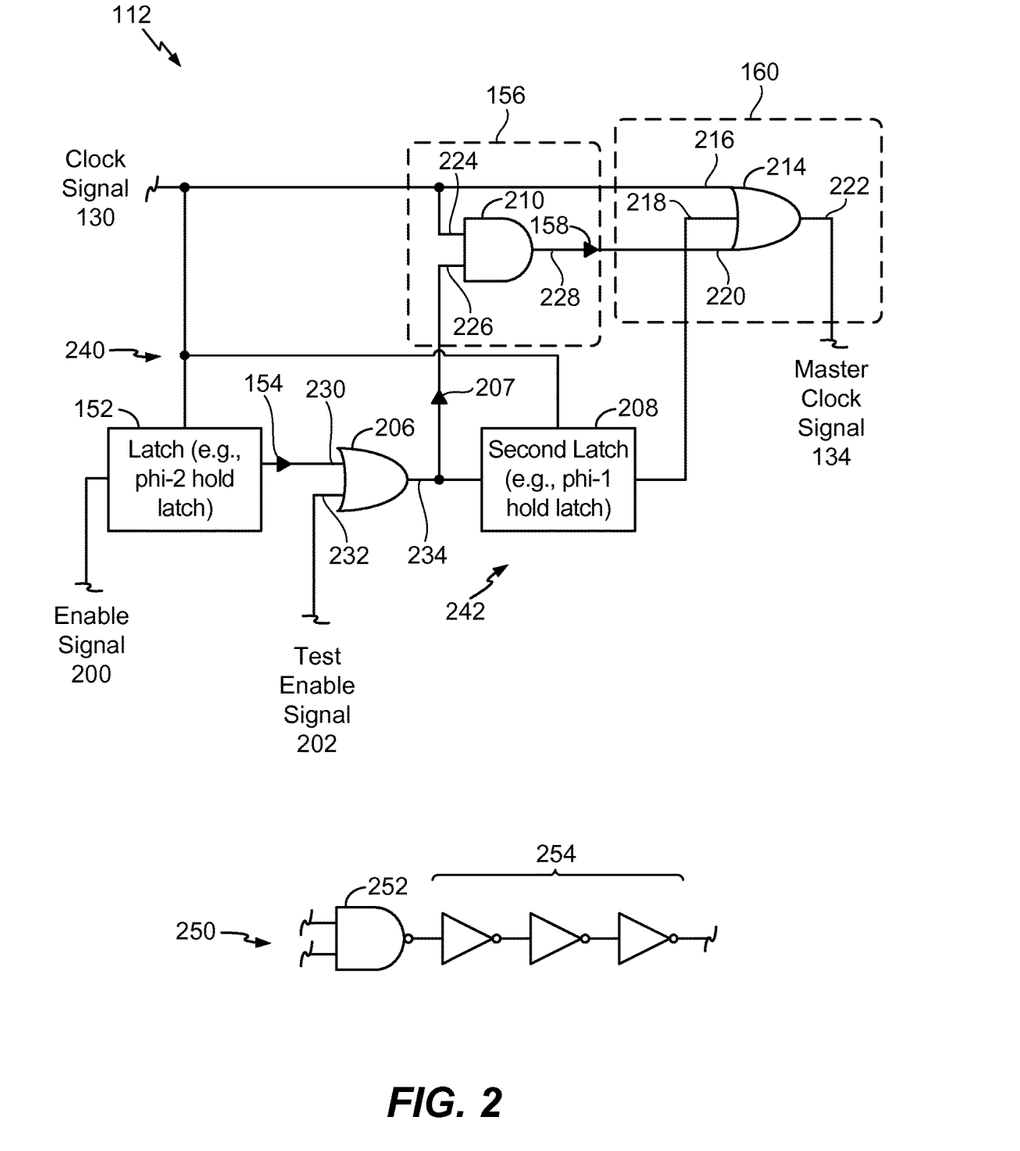
FIG. 2 is a block diagram of an illustrative example of a CGC that includes a delay circuit.

FIG. 2 depicts an illustrative example of the first CGC 112 of FIG. 1. The first CGC 112 may include the latch 152, the delay circuit 156, and the output circuit 160 of FIG. 1. The example of FIG. 2 illustrates that the delay circuit 156 may include an AND device 210, and the output circuit 160 may include an OR gate 214. The first CGC 112 may also include a second latch 208 (e.g., a phi-1 hold latch).

The latch 152, the second latch 208, the delay circuit 156, and the output circuit 160 may be configured to receive the clock signal 130. The output circuit 160 may be configured to output the master clock signal 134 (e.g., in response to an output signal of the delay circuit 156). The master clock signal 134 may have a falling edge that is delayed with respect to a falling edge of the clock signal 130.

The OR gate 214 may have a three-input (OR3) configuration. For example, the OR gate 214 may include a first input 216, a second input 218, and a third input 220. In the example of FIG. 2, the first input 216 is configured to receive the clock signal 130, the second input 218 is coupled to the second latch 208, and the third input is coupled to the delay circuit 156. The OR gate 214 may further include an output 222 configured to output the master clock signal 134. For example, the output 222 may be coupled to the master latch 104 of FIG. 1, and the OR gate 214 may be configured to provide the master clock signal 134 to the master latch 104 via the output 222.

The first CGC 112 may further include an OR gate 206 having a first input 230 and a second input 232. The first input 230 may be coupled to the latch 152. The second input 232 may be configured to receive a test enable signal 202. The OR gate 206 may further include an output 234 coupled to the second latch 208 and to the delay circuit 156. For example, the output 234 may be coupled to the second input 226 of the AND device 210.

The AND device 210 may include a first input 224 and a second input 226. The first input 224 may be configured to receive the clock signal 130. The second input 226 may be configured to be driven by the OR gate 206 and may be responsive to the latch 152. The AND device 210 may further include an output 228 coupled to the output circuit 160. For example, the output 228 may be coupled to the third input 220 of the OR gate 214.

Although FIG. 2 depicts the AND device 210 as including an AND gate for illustration, it should be appreciated that the AND device 210 may have a different configuration. For example, FIG. 2 depicts an illustrative implementation of the AND device 210, at 250. In this example, the AND device 210 may include a NOT-AND (NAND) gate 252 and one or more inverters 254. The one or more inverters 254 include an odd positive integer number of inverters (e.g., one inverter, three inverters, five inverters, or another odd positive integer number of inverters) so that the NAND gate 252 and the one or more inverters 254 function as an AND logic gate. The NAND gate 252 and the one or more inverters 254 may be configured to function as an AND gate having a delay characteristic (t) associated with the delay circuit 156. A number (n) of the one or more inverters 254 may be determined based on the delay characteristic (t). To illustrate, the number (n) of the one or more inverters 254 may be determined based on the delay characteristic (t) minus a first delay time (t1) associated with the NAND gate 252 divided by a second delay time (t2) associated with each inverter of the one or more inverters 254 (i.e., n=(t−t1)/t2).

Use of the AND device 210 may reduce power consumption of the delay circuit 156 as compared to one or more other configurations. To illustrate, the AND device 210 may be inactive in response to the OR gate 206 generating a low logic value at the output 234. Other devices (e.g., a buffer) may operate (or "toggle") in response to the clock signal 130, increasing power consumption as compared to use of the AND device 210. Further, although FIG. 2 depicts an AND gate, it should be appreciated that one or more other devices may be implemented. For example, in some applications, the delay circuit 156 may include one or more operational amplifiers, which may perform an AND logic function as described with reference to the AND device 210. Alternatively or in addition, the delay circuit 156 may include one or more other logic gates, such as such as one or more AND logic gates, one or more OR logic gates, one or more exclusive-OR (XOR) logic gates, one or more NOT-OR (NOR) logic gates, one or more exclusive-NOR (XNOR) gates, one or more other logic gates, or a combination thereof.

FIG. 2 illustrates that the first CGC 112 may include multiple clock gating sub-circuits. For example, the latch 152 and the delay circuit 156 may form a first clock gating sub-circuit 240 (e.g., a phi-1 clock gating sub-circuit), and the second latch 208 and the output circuit 160 may form a second clock gating sub-circuit 242 (e.g., a phi-2 clock gating sub-circuit). In this example, the first clock gating sub-circuit 240 may function as a phi-1 (or "regular") CGC that gates off the clock signal 130 (e.g., by outputting a low logic value) in response to an input having a low logic value (e.g., when an enable signal 200 is not asserted). The second clock gating sub-circuit 242 may function as a phi-2 CGC that outputs a high logic value in response to an input having a low logic value (e.g., when the OR gate 206 outputs a low logic value).

During a test mode of operation, the test enable signal 202 may be asserted (e.g., may have a high logic value). For example, a scan process may be performed in connection with the test mode to verify operation of an integrated circuit (e.g., a processor) that includes the first CGC 112. During the scan process, a value of the enable signal 200 may change (e.g., from a high logic value to a low logic value) as a result of one or more other operations of the scan process. In this example, the test enable signal 202 may be asserted to "bypass" the latch 152. The test enable signal 202 may cause the OR gate 206 to output a high logic value (irrespective of a value provided by the latch 152), which may cause the master clock signal 134 to track (or "follow") the clock signal 130. Thus, asserting the test enable signal 202 may ensure that the master clock signal 134 is active (e.g., oscillates) during a scan process (e.g., to verify operation of an integrated circuit that includes the master latch 104).

During one or more other modes of operation (e.g., a non-test mode of operation), the test enable signal 202 may be un-asserted. In an illustrative implementation, the enable signal 200 is asserted if the master latch 104 of FIG. 1 is to be activated. For example, if data from one pipeline stage of a device is ready to be provided to another pipeline stage of the device using the master latch 104, the enable signal 200 may be asserted to activate the master latch 104. When data is not ready to be provided between pipeline stages using the master latch 104, the enable signal 200 may be un-asserted.

While the enable signal 200 is asserted, the output circuit 160 may generate a high logic value at the output 222 in response to a transition (or rising edge) of the clock signal 130 from a low logic value to a high logic value. For example, in response to a rising edge of the clock signal 130, the OR gate 214 may transition from generating a low logic value at the output 222 to a high logic value at the output 222 to generate a rising edge of the master clock signal 134. In this case, rising edges of the master clock signal 134 may track (or "follow") rising edges of the clock signal 130.

In response to a transition (or falling edge) of the clock signal 130 from a high logic value to a low logic value while the enable signal 200 is asserted, the first signal 154 generated by the latch 152 may have a high logic value (i.e., the latch 152 may be transparent in response to a falling edge of the clock signal 130). The OR gate 206 may be responsive to the first signal 154 generated by the latch 152. In response to the first signal 154, the OR gate 206 may provide a gating signal 207 having a high logic value to the delay circuit 156 and to the second latch 208, and the second latch 208 may provide a low logic value to the output circuit 160. In this example, the first input 216 and the second input 218 receive low logic values.

The delay circuit 156 may receive the clock signal 130 and the gating signal 207 and may generate the second signal 158 based on the clock signal 130 and the gating signal 207. Because of the delay characteristic of the delay circuit 156, a value associated with the second signal 158 may temporarily remain at a high logic value after the falling edge of the clock signal 130 (e.g., for approximately t picoseconds after the falling edge). In this example, the second signal 158 generated by the delay circuit 156 may be delayed from transitioning to a low logic value, which may cause the output of the output circuit 160 to temporarily remain at a high logic value. After a delay interval between the falling edge of the clock signal 130 and the transitioning of the output of the delay circuit 156 from the high logic value to the low logic value, the second signal 158 generated by the delay circuit 156 may transition to a low logic value. As a result, a falling edge of the master clock signal 134 may be delayed with respect to a falling edge of the clock signal 130 (due to the delay circuit 156).

If no data is to be transferred using the device 100 of FIG. 1 (e.g., if results of one pipeline stage are not available to be provided to another pipeline stage using the device 100), the first CGC 112 may clock gate (e.g., deactivate) the master latch 104. For example, the enable signal 200 may be adjusted from a first value to a second value (e.g., from a high logic value to a low logic value). As a result, the latch 152 may be deactivated, which may cause the output circuit 160 to cease to provide the master clock signal 134 to the master latch 104. Thus, the master latch 104 may be deactivated based on the enable signal 200.

Delaying the falling edge of the master clock signal 134 may avoid an operating state in which the master clock signal 134 has a low logic value (causing the master latch 104 to be active, or "transparent") while one or more slave clock signals have a high logic value (causing the plurality of slave latches 108 to be transparent), which can cause a "race" condition (e.g., when an output of the device 100 is generated one clock cycle too early). Further, delaying the falling edge of the master clock signal 134 may avoid creating a half-cycle path in which operations are triggered by a falling clock edge instead of by a rising clock edge (which may occur when the master clock signal 134 has a low logic value and the slave clock signal 138 has a high logic value, and thus both the master latch 104 and the first slave latch 118 are active). Thus, delaying falling edges of the master clock signal 134 with respect to falling edges of the clock signal 130 (and falling edges of the slave clock signal 138) may avoid operating states that can reduce performance of an electronic device (e.g., by avoiding race conditions and half-cycle paths). In addition, the second clock gating sub-circuit 242 may enable phi-2 gating of the master latch 104 (e.g., the master latch 104 may "see" a phi-2 CGC instead of a phi-1 CGC). Therefore, the clock gating sub-circuits 240, 242 may enable phi-2 clock gating of the master latch 104 (without creating race conditions or half-cycle paths).

Figure 3:
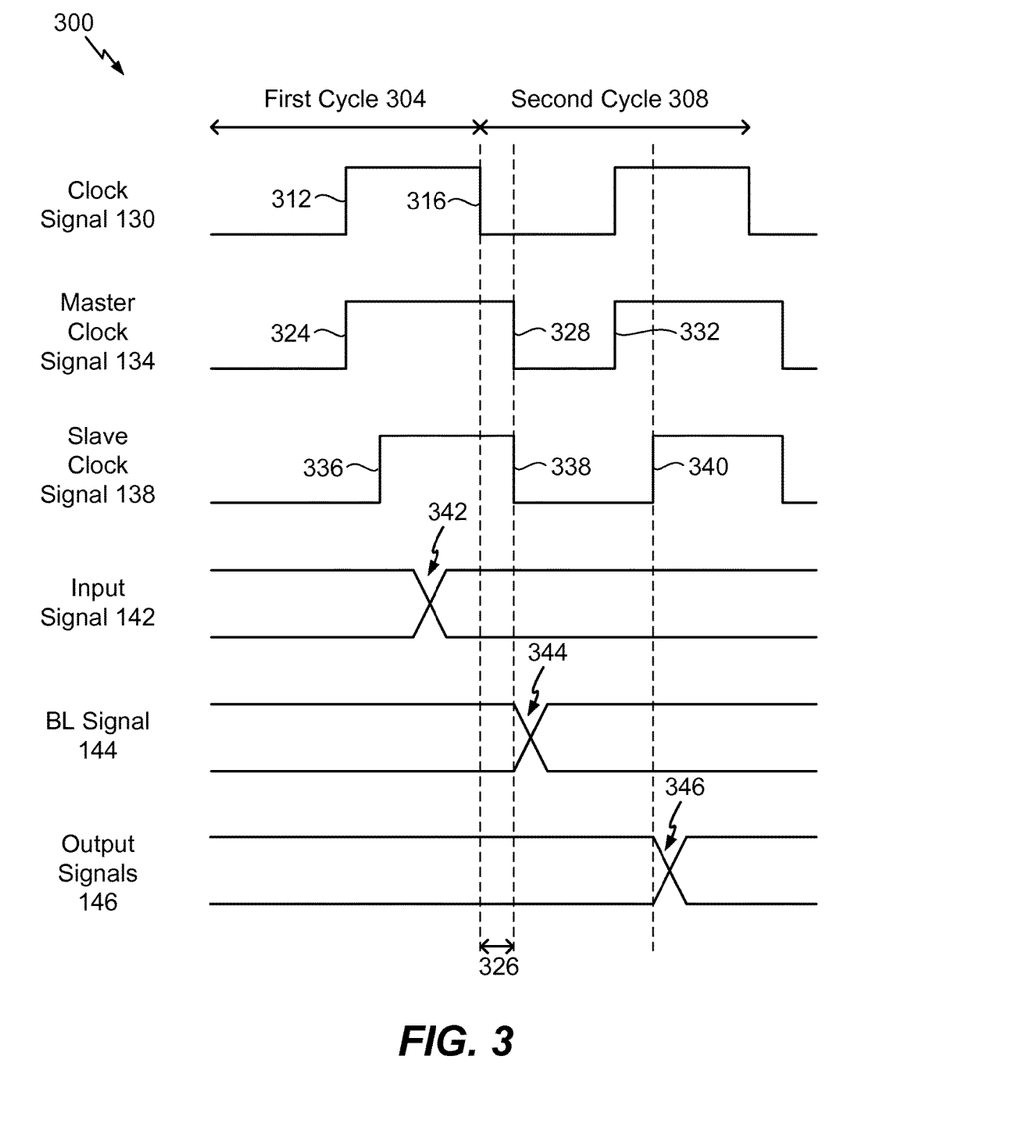
FIG. 3 is a timing diagram illustrating timing of certain operations that may be performed at a CGC that includes a delay circuit.

Referring to FIG. 3, a set of illustrative timing diagrams is depicted and generally designated 300. The set of timing diagrams 300 includes a timing diagram corresponding to the clock signal 130, a timing diagram corresponding to the master clock signal 134, a timing diagram corresponding to one or more slave clock signals generated by the plurality of second CGCs 116 (e.g., the slave clock signal 138), a timing diagram corresponding to the input signal 142, a timing diagram corresponding to the BL signal 144, and a timing diagram corresponding to the output signals 146. In FIG. 3, the clock signal 130 has a first cycle 304 and a second cycle 308.

FIG. 3 illustrates that the slave clock signal 138 may be phase-delayed (or "skewed") with respect to one or more of the clock signal 130/or the master clock signal 134. For example, during the first cycle 304, a rising edge 336 of the slave clock signal 138 may be "late" as compared to a rising edge 312 of the clock signal 130 and as compared to a rising edge 324 of the master clock signal 134. Clock skew may occur due to one or more physical circuit characteristics or operating characteristics. As an example, a particular physical circuit layout of the device 100 may cause the slave clock signal 138 to be skewed with respect to the master clock signal 134.

During the first cycle 304, the rising edge 312 of the clock signal 130 may occur simultaneously or substantially simultaneously with respect to the rising edge 324 of the master clock signal 134. FIG. 3 also illustrates that a falling edge 316 of the clock signal 130 may occur before a falling edge 328 of the master clock signal 134. For example, the delay circuit 156 may delay the falling edge 328 with respect to the falling edge 316 based on a delay characteristic 326 (e.g., the delay characteristic (t) described with reference to FIG. 2). The delay characteristic 326 may be associated with a slave clock signal, such as the slave clock signal 138. For example, the delay characteristic may be selected based on an expected or potential (e.g., "maximum") clock skew of the slave clock signal 138 relative to the master clock signal 134 based on the particular circuit design, fabrication technology, physical layout, one or more other parameters, or a combination thereof.

Delaying the falling edge 328 may avoid an operating state in which the master clock signal 134 has a low logic value and in which the slave clock signal 138 has a high logic value, which may create a "race" condition (e.g., by simultaneously activating the master latch 104 and the first slave latch 118). Depending on the particular application, the falling edge 328 may be delayed so as to occur either after a falling edge 338 of the slave clock signal 138 or substantially simultaneously with the falling edge 338.

As a result of delaying falling edges of the master clock signal 134, a duty cycle of the master clock signal 134 may be greater than one or more of a duty cycle of the clock signal 130 or a duty cycle of the slave clock signal 138. For example, because a time interval between the rising edge 324 and the falling edge 328 is greater than a time interval between the falling edge 328 and a rising edge 332, a duty cycle of the master clock signal 134 may be greater than 50% (e.g., 60%, 70%, 80%, or another percentage). One or more of duty cycle of the clock signal 130 or a duty cycle of the slave clock signal 138 may be approximately 50%.

To further illustrate, FIG. 3 depicts a transition 342 of the input signal 142, a transition 344 of the BL signal 144, and a transition 346 of the output signals 146. Although FIG. 3 depicts both high-to-low and low-to-high logic value transitions for convenience of illustration, it should be appreciated that each of the signals 142, 144, and 146 may be a single-ended signal that has a single value at a particular time. The transition 344 may occur in response to the falling edge 328 of the master clock signal 134 (e.g., the master latch 104 may have a phi-2 configuration that causes the master latch 104 to be transparent in response to low logic values of the master clock signal 134). The transition 346 may occur in response to a rising edge 340 of the slave clock signal 138 (e.g., the plurality of slave latches 108 may have a phi-1 configuration that causes the plurality of slave latches 108 to be transparent in response to high logic values of slave clock signals, such as the slave clock signal 138).

By delaying the falling edge 328, an operating state is avoided in which the transition 346 may occur "too soon." For example, by delaying the falling edge 328, an operating state is avoided in which both the master clock signal 134 has a low logic value and the slave clock signal 138 has a high logic value (e.g., due to clock skew). In this operating state, the transition 346 may occur in response to the falling edge 338 instead of the rising edge 340 (i.e., a half-cycle "too soon"). Such an operating state may result in a race condition that may cause unintended device operation. Delaying the falling edge 328 may avoid such an operating state.

Further, it is noted that if clock skew does not occur in a device, delaying the falling edge 328 does not reduce device performance. For example, if the slave clock signal 138 is in phase with respect to the clock signal 130 (and no clock skew is present), delaying falling edges of the master clock signal 134 may produce similar device performance as compared to non-delayed falling edges of the master clock signal 134. Accordingly, the delay circuit 156 may operate using an "internal" or "existing" signal of the first CGC 112 (and need not be deactivated using an external signal, such as an external enable signal provided from a device that is external to the first CGC 112).

Figure 4:
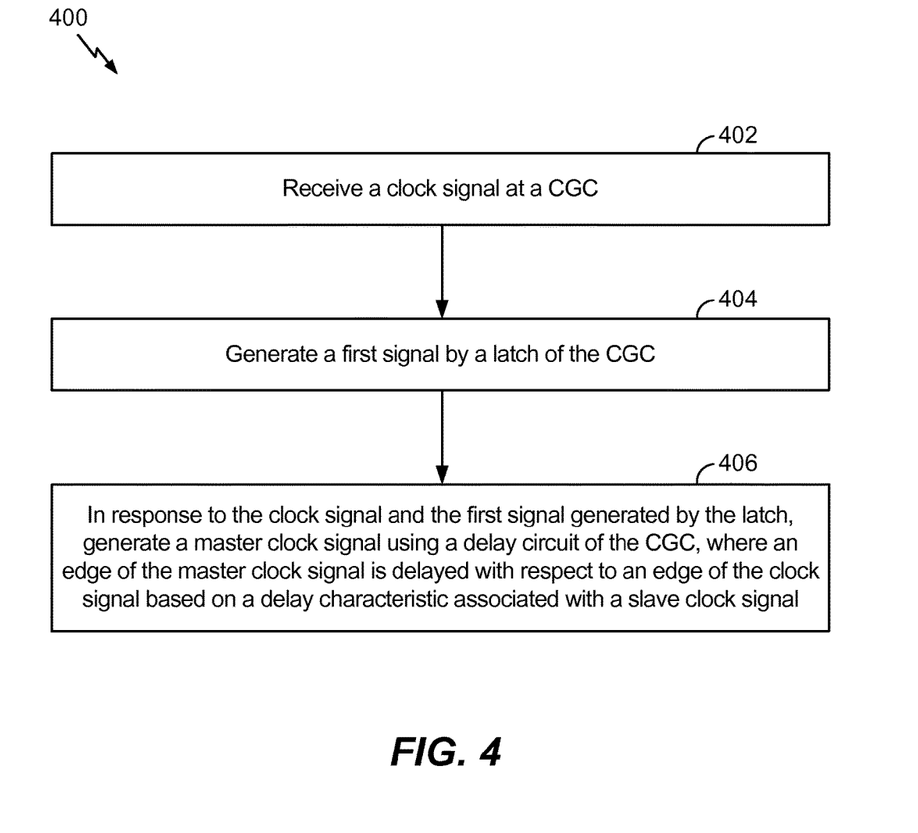
FIG. 4 is a flow chart of a particular illustrative example of a method of operation of a CGC that includes a delay circuit.

Referring to FIG. 4, an illustrative example of a method is depicted and generally designated 400. The method 400 may be performed at a device that includes a clock gating circuit, such as the device 100 and the first CGC 112, respectively.

The method 400 may include receiving a clock signal at a CGC, at 402. For example, the clock signal 130 may be received at the first CGC 112.

The method 400 may further include generating a first signal by a latch of a CGC, at 404. For example, the latch 152 may generate the first signal 154.

The method 400 may further include generating a master clock signal using a delay circuit of the CGC in response to the clock signal and the first signal generated by the latch, at 406. An edge of the master clock signal is delayed with respect to an edge of the clock signal based on a delay characteristic associated with a slave clock signal. For example, the delay circuit may correspond to the delay circuit 156, and the master clock signal may correspond to the master clock signal 134. As an additional illustrative non-limiting example, the edge of the clock signal may correspond to the falling edge 316, the edge of the master clock signal may correspond to the falling edge 328, and the delay characteristic may correspond to the delay characteristic 326 (e.g., a delay interval).

The method 400 may also include providing, by a logic gate of the CGC, a gating signal to the delay circuit in response to the first signal generated by the latch. For example, the logic gate may correspond to an OR gate, such as the OR gate 206. The OR gate 206 may generate the gating signal 207 and may provide the gating signal 207 to the delay circuit 156.

The method 400 may also include transitioning a second signal generated by the delay circuit from a first logic value (e.g., a high logic value) to a second logic value (e.g., a low logic value) in response to the edge of the clock signal (e.g., in response to the falling edge 316 of the clock signal 130). In this example, the delay characteristic may correspond to a delay interval between the edge of the clock signal and the transitioning of the output of the delay circuit. The second signal may correspond to the second signal 158.

The method 400 may further include clock-gating the master latch by deactivating the CGC by adjusting an enable signal provided to a latch of the CGC. For example, the enable signal 200 may be adjusted from a high logic value to a low logic value. The enable signal 200 may be provided to the latch 152, and adjusting the value of the enable signal may cause the first CGC 112 to clock-gate the master latch 104 (e.g., to deactivate the master latch 104).

The method 400 may further include providing a test enable signal to an OR gate of the CGC during a test mode of operation of a device and adjusting the test enable signal during a non-test mode of operation of the device. To illustrate, the test enable signal 202 may have a high logic value during a test mode of operation of the device 100. The test enable signal 202 may be adjusted from the high logic value to a low logic value in connection with a non-test mode of operation of the device 100.

By delaying falling edges of a master clock signal as described with reference to the method 400, certain race conditions may be avoided at a device. For example, a race condition due to clock skew of a slave clock signal may be avoided.

Figure 5:
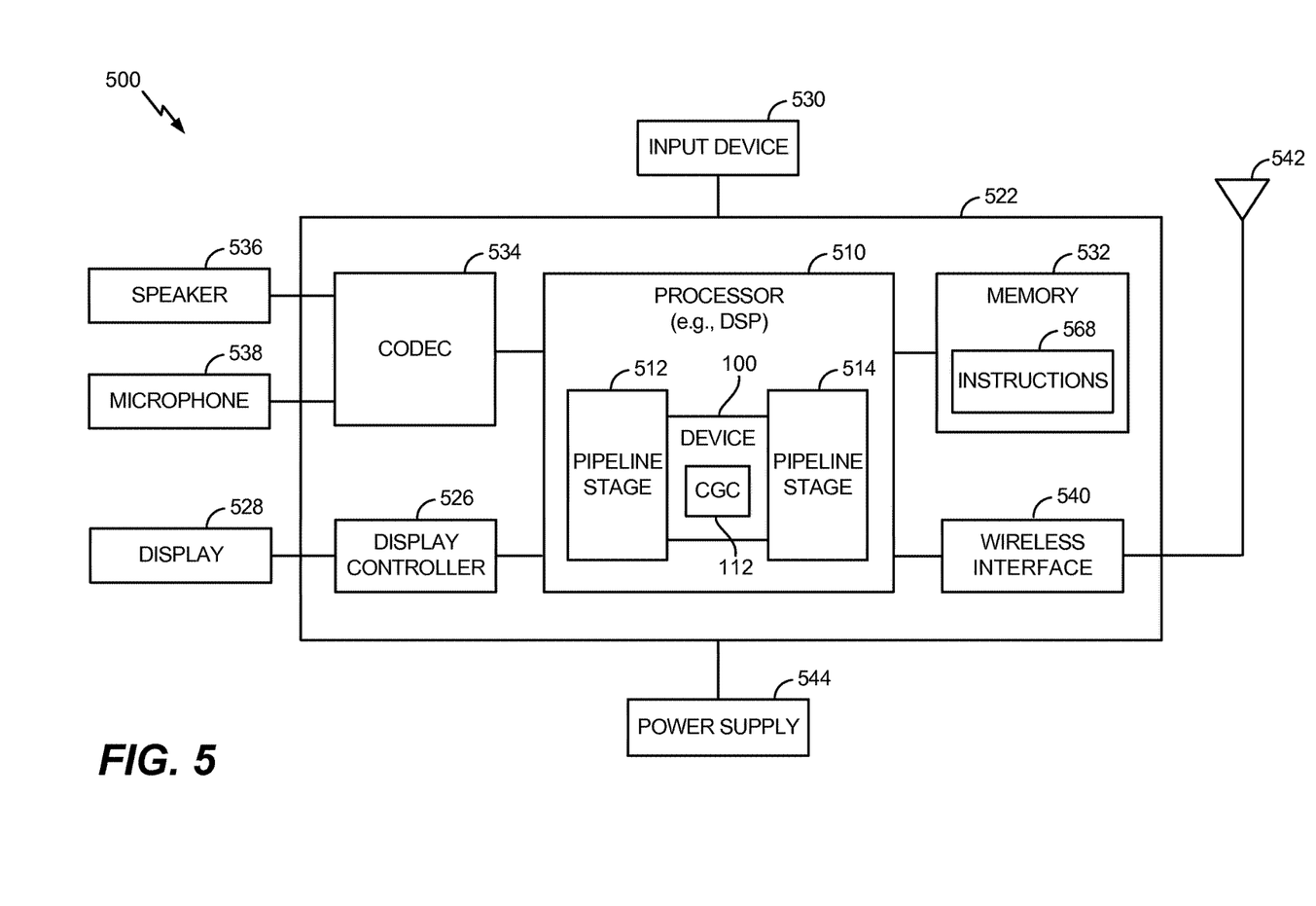
FIG. 5 is a block diagram of an electronic device that includes a processor having a CGC that includes a delay circuit.

Referring to FIG. 5, a block diagram of a particular illustrative example of an electronic device is depicted and generally designated 500. The electronic device 500 may correspond to a mobile device (e.g., a cellular telephone), as an illustrative example. In other implementations, the electronic device 500 may correspond to a computer (e.g., a laptop computer, a tablet computer, or a desktop computer), a wearable electronic device (e.g., a personal camera, a head-mounted display, or a watch), a vehicle control system or console, a home appliance, a set top box, an entertainment unit, a navigation device, a personal digital assistant (PDA), a television, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 500 includes a processor 510, such as a DSP, a CPU, a GPU, or an AP, as illustrative examples. The processor 510 may have a pipelined configuration that includes multiple pipeline stages, and a device corresponding to the device 100 of FIG. 1 may be coupled between each pair of pipeline stages. To illustrate, the processor 510 may include a first pipeline stage 512 and a second pipeline stage 514, and the device 100 (and the first CGC 112) may be coupled between the first pipeline stage 512 and the second pipeline stage 514. In an illustrative implementation, the first CGC 112 is as described with reference to FIG. 2. The device 100 may operate based on the set of timing diagrams 300 of FIG. 3, based on the method 400 of FIG. 4, or a combination thereof.

The electronic device 500 may further include a memory 532. The memory 532 is coupled to the processor 510. The memory 532 includes instructions 568 that are accessible by the processor 510. The instructions 568 may include one or more instructions that are executable by the processor 510. For example, the instructions 568 may be executable by the processor 510 to initiate or control certain operations described herein. For example, the instructions 568 may be executable by the processor 510 to perform one or more arithmetic operations or logic operations using the pipeline stages 512, 514.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534. FIG. 5 also indicates that a wireless interface 540 (e.g., one or more of a wireless controller or a transceiver) may be coupled to the processor 510 and to an antenna 542.

In a particular example, the processor 510, the display controller 526, the memory 532, the CODEC 534, and the wireless interface 540 are included in one or more of a package, a system-in-package (SiP) device, or a system-on-chip (SoC) device, such as an SoC device 522. Further, an input device 530 and a power supply 544 may be coupled to the SoC device 522. Moreover, in a particular example, as illustrated in FIG. 5, the display 528, the input device 530, the speaker 536, the microphone 538, the antenna 542, and the power supply 544 are external to the SoC device 522. However, each of the display 528, the input device 530, the speaker 536, the microphone 538, the antenna 542, and the power supply 544 can be coupled to a component of the SoC device 522, such as to an interface or to a controller.

In a particular example, an apparatus includes means for generating a first signal at a CGC (e.g., the first CGC 112). For example, the means for generating the first signal may include the latch 152. The apparatus further includes means for receiving a clock signal (e.g., the clock signal 130) at the CGC. The apparatus further includes means for generating, in response to the clock signal and the first signal, a master clock signal (e.g., the master clock signal 134) using a delay circuit of the CGC (e.g., the delay circuit 156). An edge of the master clock signal (e.g., a falling edge, such as the falling edge 328) is delayed with respect to a falling edge of the clock signal (e.g., the falling edge 316) based on a delay characteristic (e.g., the delay characteristic 326) associated with a slave clock signal (e.g., the slave clock signal 138). For example, the means for receiving the clock signal may include one or more of the latch 152, the second latch 208, the NAND gate 252, or the first input 216 to the OR gate 214. As another example, the means for generating the master clock signal may include the output circuit 160 that includes the OR gate 214.

For convenience of description, the master latch 104 has been described as a phi-2 latch, and each of the plurality of slave latches 108 has been described as a phi-1 latch. It should be appreciated that in some applications, a master latch may be a phi-1 latch, and a slave latch may be a phi-2 latch. In this case, certain structures and functionalities described with reference to the first CGC 112 may be implemented at the plurality of second CGCs 116 (e.g., instead of implementing such structures and functionalities at the first CGC 112). Further, in some applications, a rising edge of a clock signal may be delayed alternatively or in addition to delaying a falling edge of a clock signal. For example, a CGC may be configured to delay a rising edge of a clock signal that is provided to a phi-1 latch (alternatively or in addition to delaying a falling edge of a clock signal that is provided to a phi-1 latch).

The foregoing disclosed devices and functionalities described with reference to one or more of FIGS. 1-5 may be designed and represented using computer files (e.g., RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices. For example, the SoC device 522 may be employed in the electronic device 500, as described with reference to FIG. 5.

Although FIGS. 1-5 may describe certain examples separately for convenience, the disclosure is not limited to these illustrated examples. For example, one or more functions or components of any of FIGS. 1-5 as illustrated or described herein may be combined with one or more other functions or components of another of FIGS. 1-5. Accordingly, no single example described herein should be construed as limiting, and examples of the disclosure may be combined without departing from the scope of the disclosure.

Those of skill would further appreciate that the various illustrative logical blocks, configurations, modules, circuits, and algorithm steps described in connection with the examples described herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

Certain operations described herein may be initiated, controlled, or performed using hardware, instructions executed by a processor, or in a combination thereof. For example, operations of the method 400 of FIG. 4 may be initiated using hardware, executable instructions, or a combination thereof. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed examples is provided to enable a person skilled in the art to make or use the disclosed examples. Various modifications to these examples will be readily apparent to those skilled in the art, and the principles defined herein may be applied to other examples without departing from the scope of the disclosure. Thus, the present disclosure is not intended to be limited to the examples shown herein but is to be accorded the widest scope possible consistent with the principles and novel features as defined by the following claims.

What is claimed is:

1. An apparatus comprising:
 a clock gating circuit (CGC) comprising:
  a first latch configured to generate a first signal in response to a clock signal;
  a delay circuit configured to receive the clock signal and to generate a second signal based on the clock signal and the first signal; and
  an output circuit coupled to the delay circuit and to the first latch, the output circuit configured to generate a master clock signal based on the clock signal and the second signal, wherein an edge of the master clock signal is delayed with respect to an edge of the clock signal based on a delay characteristic associated with a slave clock signal;
 a second latch coupled to the CGC and configured to receive the master clock signal; and
 a third latch configured to receive the slave clock signal.

2. The apparatus of claim 1, wherein the CGC further comprises a fourth latch, wherein the first latch and the delay circuit form a first gating sub-circuit, and wherein the fourth latch and the output circuit form a second clock gating sub-circuit.

3. The apparatus of claim 1, wherein the master clock signal has a falling edge that is delayed with respect to a falling edge of the clock signal.

4. The apparatus of claim 1, wherein the delay circuit includes an AND device.

5. The apparatus of claim 4, wherein the AND device has a first input configured to receive the clock signal and a second input responsive to the first latch.

6. The apparatus of claim 4, wherein the AND device includes a NOT-AND (NAND) gate and one or more inverters, the NAND gate and the one or more inverters configured to function as an AND gate having a delay characteristic associated with the delay circuit.

7. The apparatus of claim 1, further comprising an OR gate having a three-input (OR3) configuration.

8. The apparatus of claim 7, wherein the OR gate includes a first input coupled to the first latch and further includes a second input configured to receive a test enable signal.

9. The apparatus of claim 1, further comprising a fourth latch, wherein the output circuit includes an OR gate having a first input configured to receive the clock signal, a second input coupled to the fourth latch, and a third input coupled to the delay circuit.

10. The apparatus of claim 1, further comprising:
 a first pipeline stage of a processor; and
 a second pipeline stage of the processor,
 wherein the CGC is coupled between the first pipeline stage and the second pipeline stage.

11. The apparatus of claim 1, further comprising:
 a flip-flop that includes the second latch and the third latch; and
 a second CGC coupled to the third latch, the second CGC configured to provide the slave clock signal to the second latch.

12. A method of operation of a clock gating circuit (CGC), the method comprising:

receiving a clock signal at a CGC;
generating a first signal by a first latch of the CGC;
in response to the clock signal and the first signal generated by the first latch, generating a master clock signal using a delay circuit of the CGC, wherein an edge of the master clock signal is delayed with respect to an edge of the clock signal based on a delay characteristic associated with a slave clock signal;
providing the master clock signal to a second latch; and
providing the slave clock signal to a third latch.

13. The method of claim 12, further comprising providing, by a logic gate of the CGC, a gating signal to the delay circuit in response to the first signal generated by the first latch.

14. The method of claim 13, further comprising transitioning a second signal generated by the delay circuit from a first logic value to a second logic value in response to the edge of the clock signal.

15. The method of claim 14, wherein the delay characteristic corresponds to a delay interval between the edge of the clock signal and the transitioning of the second signal from the first logic value to the second logic value.

16. The method of claim 12, further comprising clock-gating the first latch and deactivating the CGC by adjusting an enable signal provided to the first latch.

17. The method of claim 12, further comprising providing a test enable signal to an OR gate of the CGC during a test mode of operation of a device.

18. The method of claim 17, further comprising adjusting the test enable signal during a non-test mode of operation of the device.

19. An apparatus comprising:
means for generating a first signal at a clock gating circuit (CGC);
means for receiving a clock signal at the CGC;
means for generating, in response to the clock signal and the first signal, a master clock signal using a delay circuit of the CGC, wherein an edge of the master clock signal is delayed with respect to an edge of the clock signal based on a delay characteristic associated with a slave clock signal;
means for latching data based on the master clock signal; and
means for latching data based on the slave clock signal.

20. The apparatus of claim 19, wherein the means for generating the first signal includes a first latch, and wherein the means for receiving the clock signal includes one or more of a second latch, a NOT-AND (NAND) gate, or an input to an OR gate.

* * * * *